(12) United States Patent
Miyagawa et al.

(10) Patent No.: US 6,249,116 B1
(45) Date of Patent: Jun. 19, 2001

(54) DRIVING UNIT OF CROSS-COIL TYPE INDICATING INSTRUMENT

(75) Inventors: Isao Miyagawa, Kariya; Kenichi Yamada, Chita-gun, both of (JP)

(73) Assignee: Denso Corporation, Aichi-Pref (JP)

( * ) Notice: Subject to any disclaimer, the term of this patent is extended or adjusted under 35 U.S.C. 154(b) by 0 days.

(21) Appl. No.: 09/318,741

(22) Filed: May 26, 1999

(30) Foreign Application Priority Data

Jun. 9, 1998 (JP) .................................................. 10-161026
Jun. 26, 1998 (JP) .................................................. 10-180756

(51) Int. Cl.[7] ............................... G01R 1/20; G01R 5/16; H01R 13/02; H01R 9/24; H01R 27/29
(52) U.S. Cl. ........................... 324/146; 336/65; 336/192; 439/884
(58) Field of Search ..................................... 324/144, 145, 324/146, 147, 149; 336/65, 192; 439/884, 888, 890; 29/857, 874, 747

(56) References Cited

U.S. PATENT DOCUMENTS 2,953,758 * 9/1960 Stanwyck ............................... 336/65

FOREIGN PATENT DOCUMENTS

| 3-182067 | 8/1991 | (JP) . |
| 5-215779 | 8/1993 | (JP) . |
| 9-304430 | 11/1997 | (JP) . |

* cited by examiner

*Primary Examiner*—Walter E. Snow
(74) *Attorney, Agent, or Firm*—Pillsbury Winthrop LLP

(57) ABSTRACT

A driving unit of a cross-coil type indicating instrument includes a bobbin and a pair of cross-coils crossing each other, a plurality of terminals having an edge portion, a bent portion, and a rod portion. The edge portion is bent at the bent portion to extend toward the cross-coils, and each of the pair of cross coils has a wire end wound around a spool portion formed in the edge portion and soldered thereto. Each of the male terminals has a dam for holding melting solder between the spool portion and the bent portion.

9 Claims, 7 Drawing Sheets

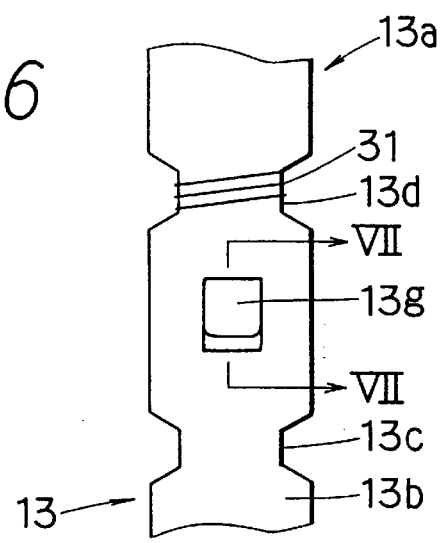
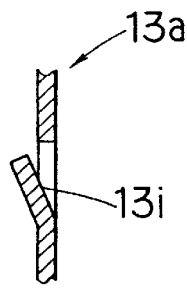
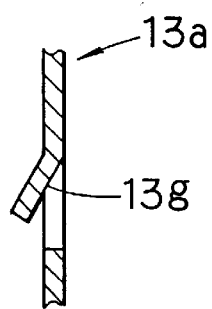
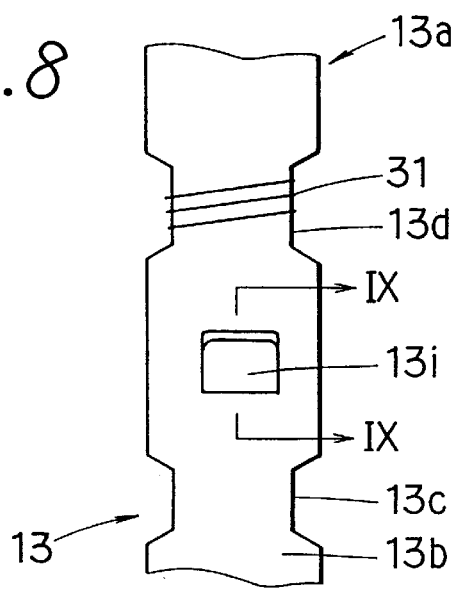
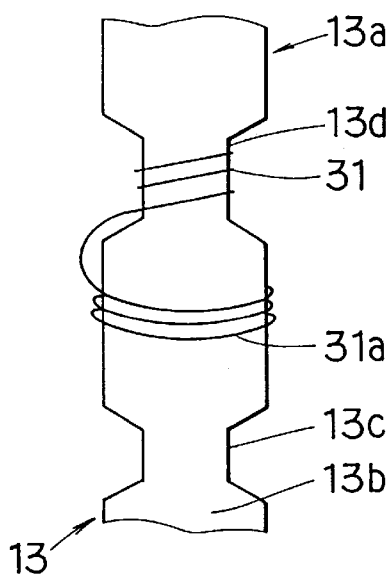

DRIVING UNIT OF CROSS-COIL TYPE INDICATING INSTRUMENT

CROSS REFERENCE TO RELATED APPLICATION

The present application is based on and claims priority from Japanese Patent Applications Hei 10-161026 filed on Jun. 9, 1998, and Hei 10-180756 filed on Jun. 26, 1998, the contents of which are incorporated herein by reference.

BACKGROUND OF THE INVENTION

1. Field of the Invention

The present invention relates to a driving unit of a cross-coil type indicating instrument.

2. Description of the Related Art

JP-A-9-304430 discloses a driving unit of a cross-coil type indicating instrument which has a hollow bobbin with a pair of cross coils and a plurality of terminal holders disposed around the pair of cross coils. A male terminal is held in each of the terminal holders. The male terminal has an L-shaped edge portion extending in the terminal holder toward the cross coils and a rod portion extending axially downward.

Wire ends of the pair of cross coils are respectively wound around spool portions of the edge portions and soldered thereto before being bent. In the soldering step, melting solder flows from the spool portion downward along peripheries of the connection end to the portion that is bent thereafter.

If the solder flowing downward and becomes solid at the portion to be bent, it is difficult to bend the edge portion. This may also cause incomplete electrical connection of the terminals and the pair of cross-coils.

SUMMARY OF THE INVENTION

A main object of the invention is to provide an improved structure of a cross-coil type indicating instrument that makes the soldering process easier.

According to an aspect of the invention, each of the male terminals has a dam for holding melt-solder disposed between the spool portion and the bent portion. The dam can be a through hole, a projection, a tongue member, or a part of the wire end.

Another object of the invention is to provide an improved driving unit in which a printed circuit board and cross-coils can be assembled easily.

According to another aspect of the invention, a plurality of connectors are connected to the printed circuit board to be coupled with the plurality of male terminals. The connector is composed of an upper wall having an opening for receiving the male terminal, a plurality of legs engaged with the printed circuit board, and a pair of female terminal members engaged with the rod portion of the male terminal. At least one of the legs can have a stopper arm extending from a portion at the middle thereof for restricting distortion of the connector relative to the printed circuit board.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

FIG. 6 is a side view illustrating a variation of the embodiment;

FIG. 7 is a cross-sectional view cut along line VII—VII in FIG. 6;

FIG. 8 is a side view illustrating a variation of the embodiment;

FIG. 9 is a cross-sectional view cut along line IX—IX in FIG. 8;

FIG. 10 is a side view illustrating a variation of the embodiment;

DETAILED DESCRIPTION OF THE PREFERRED EMBODIMENTS

Figure 1:
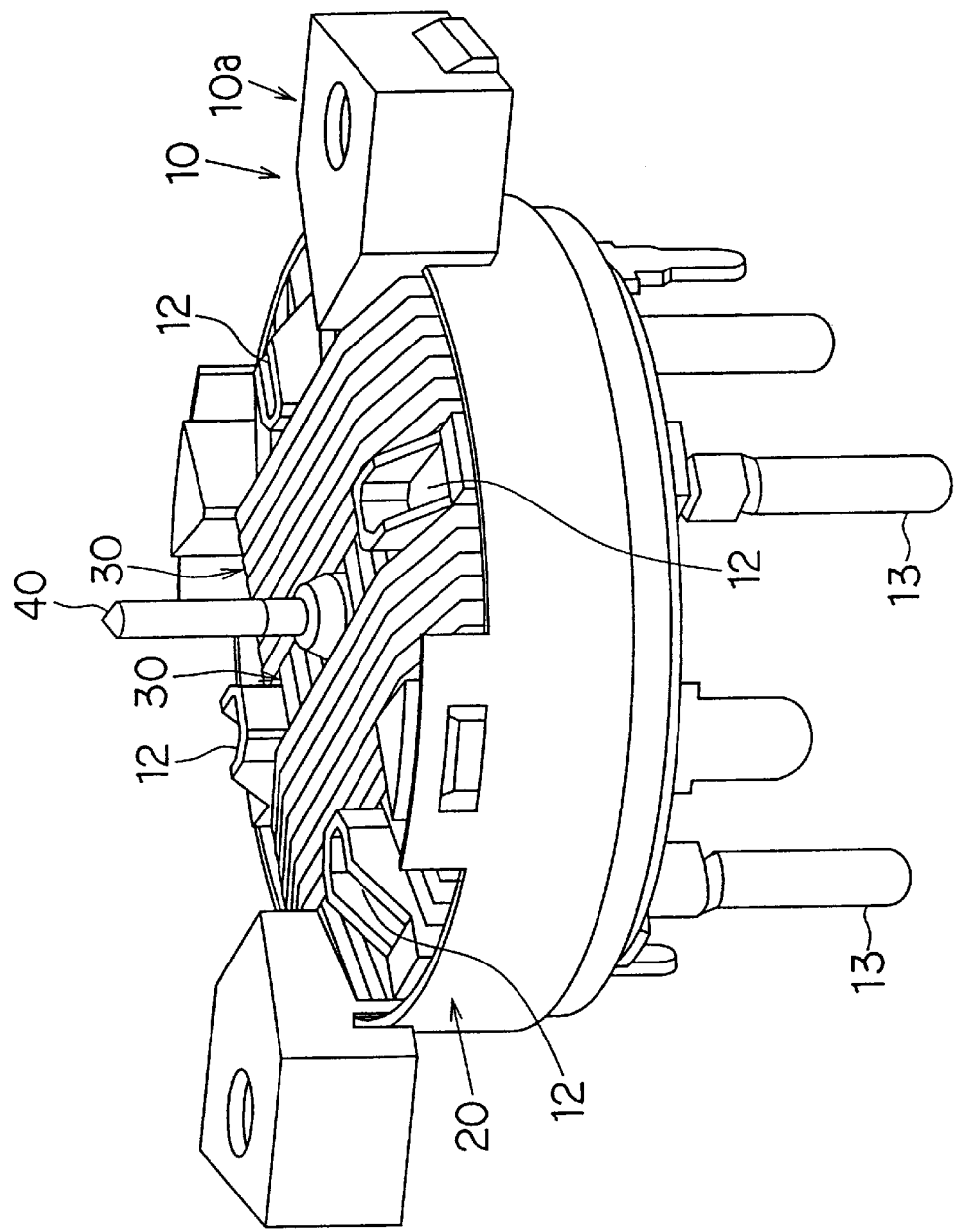
FIG. 1 is a perspective view of a main portion of a driving unit of a cross-coil type vehicle indicating instrument according to a preferred embodiment.
Figure 2:
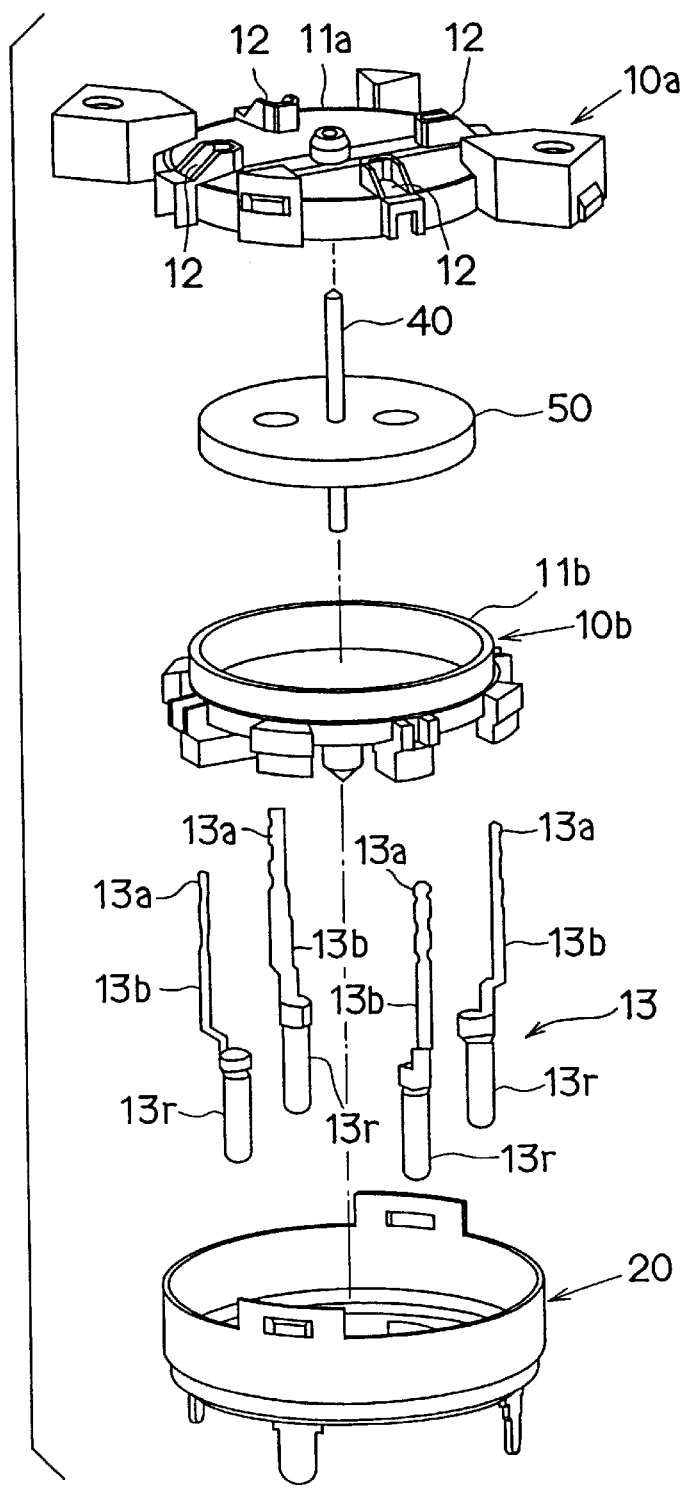
FIG. 2 is an exploded view of the driving unit shown in FIG. 1 without a cross-coil unit.
Figure 3:
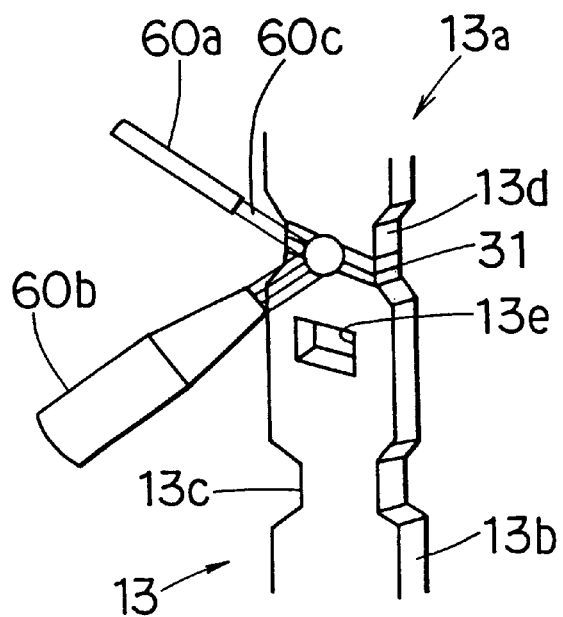
FIG. 3 is a schematic perspective view illustrating a connecting end of the cross-coils wound around and soldered to a terminal spool portion of the driving unit.

A driving unit of a cross-coil type indicating instrument for a vehicle according to a preferred embodiment of the invention is described with reference to FIGS. 1–3.

The driving unit of the cross-type indicating instrument is composed of bobbin 10, shield casing 20, a pair of cross-coils 30, pointer shaft 40, and permanent-magnet rotor 50. The driving unit is installed into a printed board via plural connectors as described later.

Bobbin 10 is composed of upper bobbin member 10a and lower bobbin member 10b. Upper bobbin 10a has four terminal holders 12 disposed at equal intervals on the outer periphery of upper annular portion 11a. Each of terminal holders 12 is provided with male terminal 13 extending in the axial direction of the bobbin 10. Each of terminals 13 has edge portion 13a, base portion 13b, slender-necked bent portion 13c, and rod portion 13r. Edge portion 13a has spool-portion 13d formed at the middle thereof and rectangular through hole 13e below spool portion 13d. Through hole 13d functions as a dam which prevents melt-solder from flowing down to bent portion 13c. Through hole 13d is not limited to be rectangular but can be round, elliptic, or triangular. Bent portion 13c is formed between through hole 13d and base portion 13b to be narrower than the other portions.

The pair of cross coils 30 is wound around upper and lower annular portions 11a and 11b to cross each other. Pointer shaft 40 is rotatably supported by upper and lower bobbin members 10a and 10b. The pair of cross-coils 30 has wire ends 31, each of which is wound around spool portion 13d of one of male terminals 13 and soldered thereto by a laser-beam heater 60b as shown in FIG. 3.

While wire end 31 is being soldered to spool portion 13d, a portion of melting solder may flow along a peripheral portion of edge portion 13a down to through hole 13e.

However, through hole 13e dams up the melting solder until the solder becomes solid.

Thus, spool portion 13c is free from the solder, so that terminal 13 can be bent at bent portion 13c easily to form an L-shape.

Figure 4:
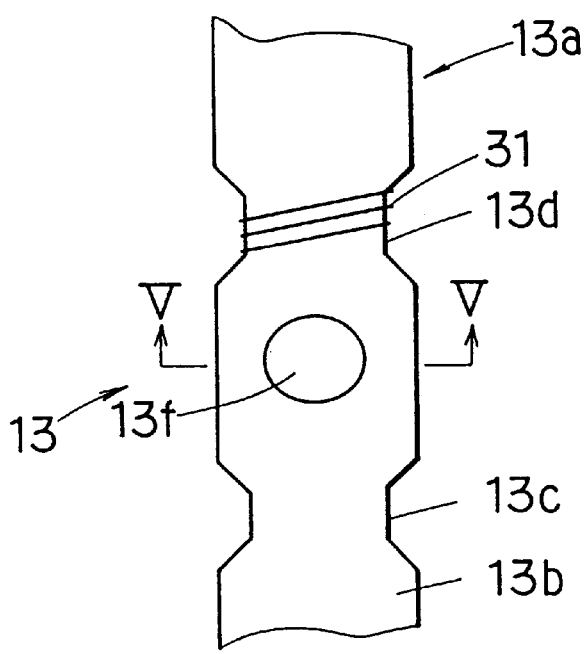
FIG. 4 is a side view illustrating a variation of the embodiment.
Figure 5:
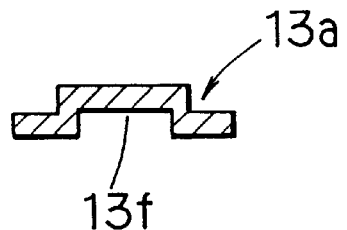
FIG. 5 is a cross-sectional view cut along line V—V in FIG. 4.

Through hole 13e can be substituted by a dam member such as projection 13f shown in FIGS. 4 and 5, downwardly extending tongue member 13g shown in FIGS. 6 and 7, or upwardly extending tongue member 13i shown in FIGS. 8 and 9.

Through hole 13e can be substituted by a portion 31a of the wire ends wound around a portion of edge portion 13a below spool portion 13d as shown in FIG. 10.

Permanent magnet rotor 50 is disposed inside upper and lower annular portions 11a and 11b with damper oil and carried by pointer shaft 40. Rotor 50 is driven by the pair of cross coils 30.

Figure 11:
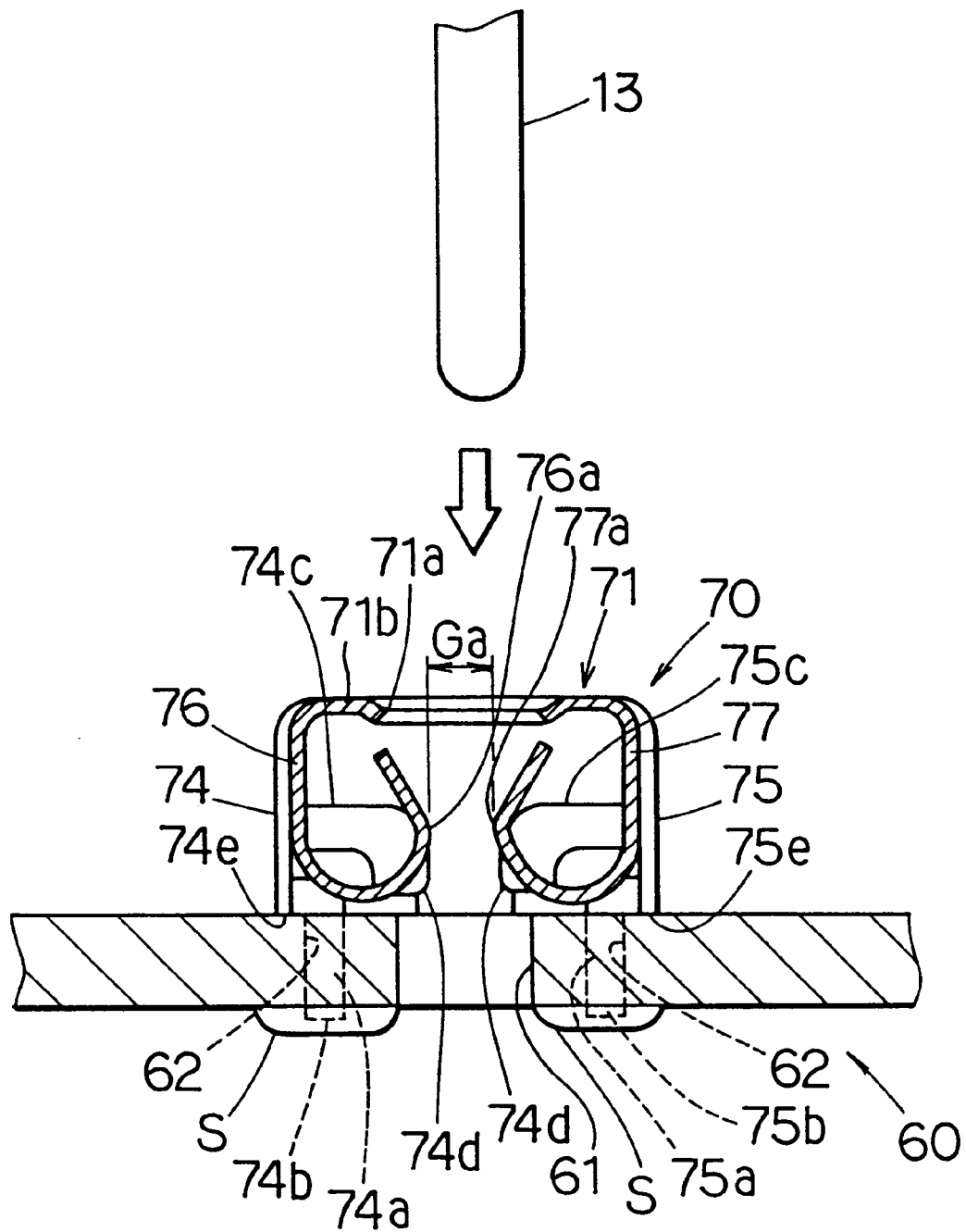
FIG. 11 is a cross-sectional front view of a connector of the driving unit.
Figure 12:
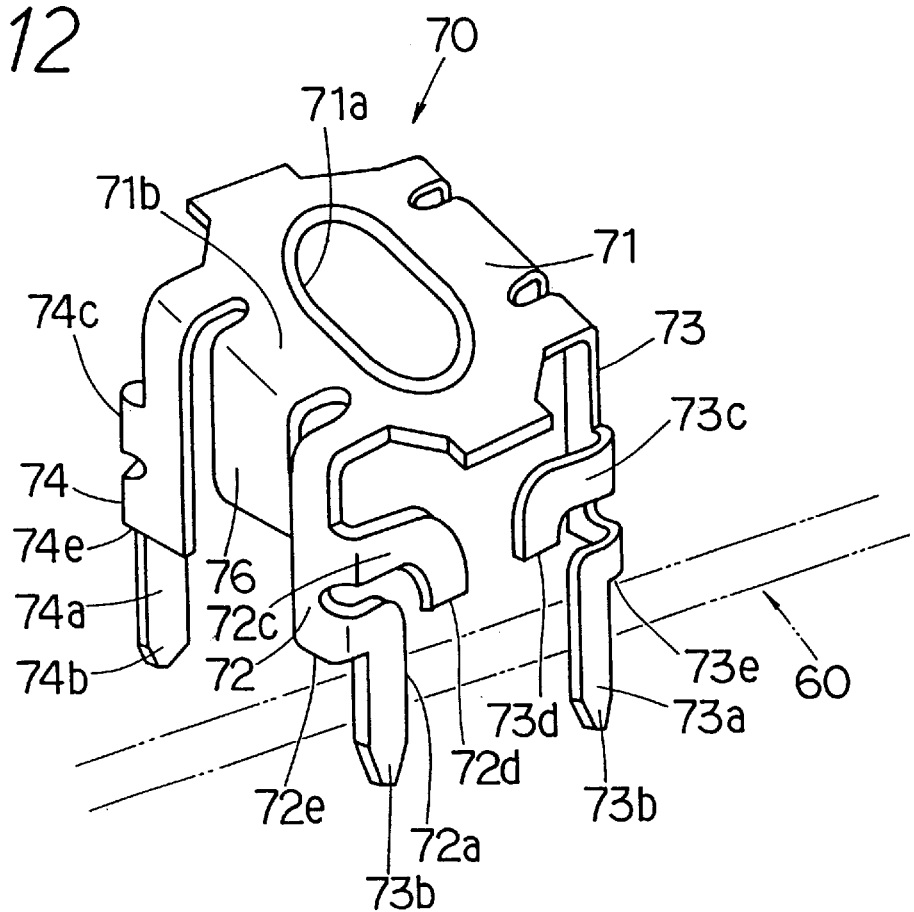
FIG. 12 is a schematic perspective view of the connector shown in FIG. 12.

The driving unit is fixed to printed board 60 of the indicating instrument via connector 70 as shown in FIG. 11.

Printed board 60 has center through hole 61 and four support holes 22 formed therearound.

Figure 15:
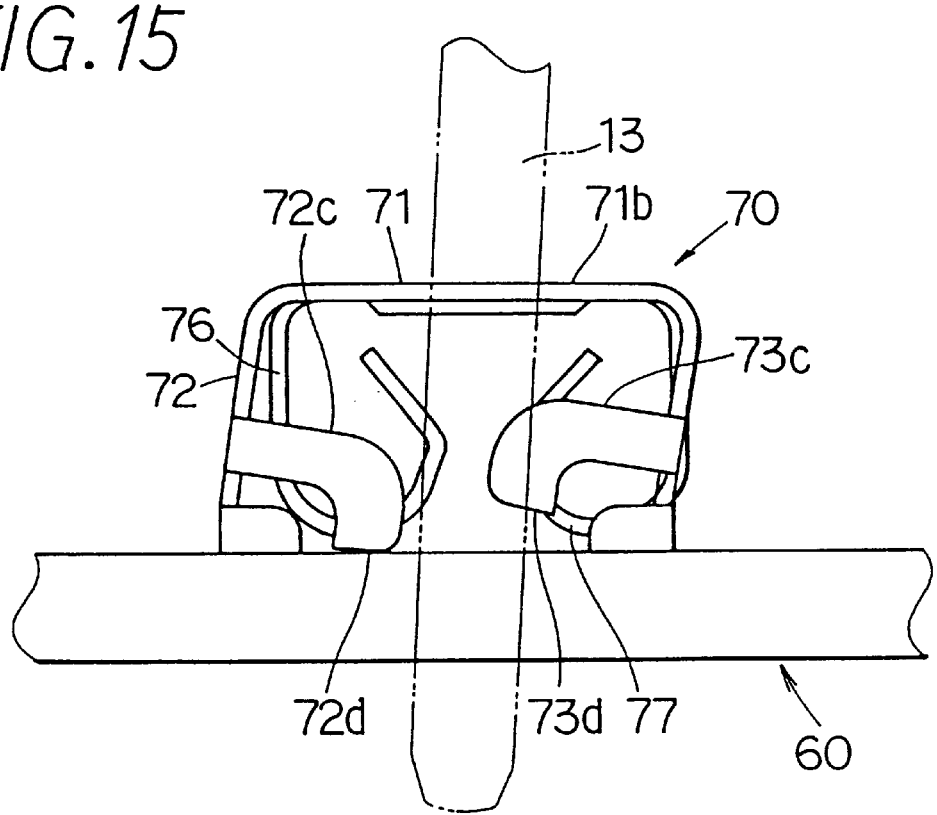
FIG. 15 is a schematic diagram of the connector being assembled.

Connector 70 has gradually-depressed upper wall 71, a pair of front legs 72 and 73, a pair of rear legs 74 and 75, and a pair of hook-shaped female terminal members 76 and 77. Upper wall 71 has opening 71a for receiving one of male terminals 13 and flat portion 71b. Each of the pair of front legs 72 and 73 is inserted into one of front side support holes 22 and soldered thereto at respective edge portions 72a and 73a, as indicated by letter S. The pair of rear legs 74, 75 is also inserted into rear side support holes 22 and soldered thereto at respective edge portions 74a, 75a thereof, as indicated by letter S. Front leg 72 has L-shaped stopper arm 72c extending from the middle portion so that arm edge 72d is located at a distance G from the upper surface of printed board 60. Accordingly, arm edge 72d abuts on the upper surface to limit distortion if connector 70 is distorted excessively, as illustrated in FIG. 15. The other front leg 73 has the same L-shaped stopper arm 73c extending symmetrically with stopper arm 72c from the middle portion thereof in the same manner as leg 72. The pair of rear legs 74 and 75 has the same L-shaped stopper arms 74c, 75c as described above.

Front legs 72, 73 have, respectively, bearing surfaces 72e, 73e formed at the middle thereof seated on the surface of printed board 60. Rear legs 74, 75 also respectively have bearing surfaces 74e, 75e formed at the middle thereof seated on the surface of printed board 60.

Female terminal member 76 extends downward from flat portion 71b between front leg 72 and rear leg 74 and curves upward to a portion beneath upper wall 71, and female terminal member 77 extends symmetrically with terminal member 76 from flat portion 71b between front leg 73 and rear leg 75 in the same manner as above. The pair of female terminal members 76 and 77 has contact surfaces 76a and 77a facing each other at a distance Ga. The bottoms of the pair of female terminal members 76, 77 face the upper surface of printed circuit board 60 at a distance approximately equal to distance G.

Connectors 70 for other male terminals 13 are the same in structure.

Figure 13:
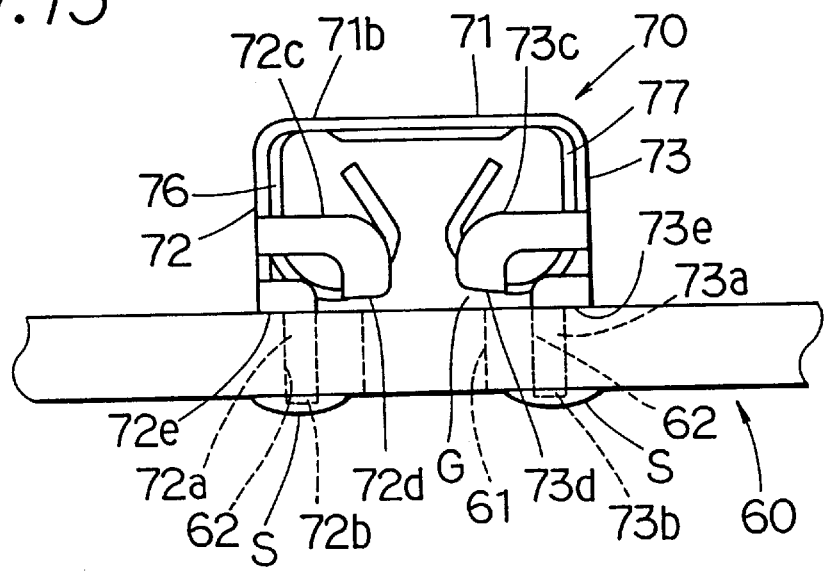
FIG. 13 is a front view of the connector.
Figure 14:
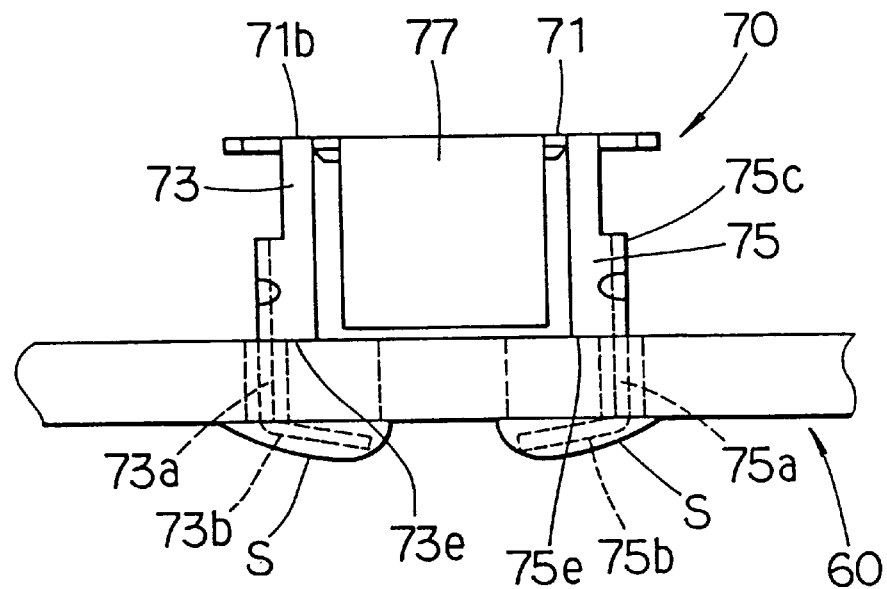
FIG. 14 is a side view of the connector.

Each one of connectors 30 is fixed to printed board 60 with legs 72–75 being inserted into respective support holes 22 and bent at end portions 72b–75b thereof as shown in FIGS. 13 and 14. The assembled printed board 60 is exposed to soldering flux at the back thereof to apply the soldering flux to the back surface of printed board 60. Then, printed board 60 is dipped in a spouted flow of melting solder to connect edge portions 72b–75b to corresponding control circuits printed on the back of printed board 60.

The rod portion of each male terminal 13 is inserted from opening 71a along gradually depressed wall 71 into central through hole 61 between female terminal members 76 and 77.

If one of male terminals 13 is not positioned correctly, the rod portion engages gradually-depressed wall 71 and turns connector 70 within an angle restricted by stopper arms 72c–75c so that opening 71a can receive the rod portion as illustrated in FIG. 15. Because upper wall 71 has flat portion 71b, whether the rod portion is positioned correctly or not can be checked easily.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A driving unit of a cross-coil type indicating instrument comprising:
   a bobbin;
   a pair of coils crossing each other disposed on said bobbin, each of said pair of cross coils having a wire end; and
   a plurality of male terminals connected to said pair of coils and extending from said bobbin, each of said plurality of male terminals having an edge portion, a bent portion, and a rod portion, said edge portion having a spool portion to which said wire end is soldered and being bent at said bent portion to extend toward said cross-coils, wherein
   each of said male terminals has a dam for holding melting solder between said spool portion and said bent portion.

2. The driving unit as claimed in claim 1, wherein said dam includes a through hole.

3. The driving unit as claimed in claim 1, wherein said dam comprises a projection.

4. The driving unit as claimed in claim 1, wherein said dam comprises a tongue member.

5. The driving unit as claimed in claim 1, wherein said dam comprises a part of said wire end wound around said edge portion.

6. The driving unit as claimed in claim 1 further comprising a printed circuit board and a plurality of connectors connected to said printed circuit board and coupled respectively with said plurality of male terminals.

7. The driving unit as claimed in claim 6, wherein said connector comprises an upper wall having an opening for receiving said male terminal, a plurality of legs engaged with said printed circuit board, and a pair of female terminal members engaged with said rod portion of said male terminal.

8. The driving unit as claimed in claim 7, wherein at least one of said legs has a stopper arm extending from a middle portion thereof for restricting distortion of said connector relative to said printed circuit board.

9. The driving unit as claimed in claim 6, wherein said upper wall is composed of a gradually depressed center portion having said opening and a flat surface around said center portion.

\* \* \* \* \*